(12) United States Patent
Kawakami

(10) Patent No.: US 6,596,382 B2
(45) Date of Patent: Jul. 22, 2003

(54) MULTILAYERED BOARD AND METHOD FOR FABRICATING THE SAME

(75) Inventor: Hiromichi Kawakami, Moriyama (JP)

(73) Assignee: Murata Manufacturing Co. Ltd.

( * ) Notice: Subject to any disclaimer, the term of this patent is extended or adjusted under 35 U.S.C. 154(b) by 55 days.

(21) Appl. No.: 09/906,016

(22) Filed: Jul. 11, 2001

(65) Prior Publication Data

US 2002/0029838 A1 Mar. 14, 2002

(30) Foreign Application Priority Data

Jul. 21, 2000 (JP) ........................................ 2000-220186

(51) Int. Cl.$^7$ ................................................. B32B 3/00
(52) U.S. Cl. ........................ 428/210; 428/209; 174/258
(58) Field of Search ........................ 156/89.12, 89.16, 156/89.17, 89.18, 289; 428/210, 209; 174/258

(56) References Cited

U.S. PATENT DOCUMENTS

| | | | | |
|---|---|---|---|---|
| 4,313,900 A | * | 2/1982 | Gonzales, Jr. et al. | 264/61 |
| 4,406,844 A | * | 9/1983 | Froot | 264/21 |
| 4,672,152 A | * | 6/1987 | Shinohara et al. | 174/68.5 |
| 4,752,531 A | * | 6/1988 | Steinberg | 428/426 |
| 4,788,046 A | * | 11/1988 | Barringer et al. | 423/122 |
| 5,070,046 A | * | 12/1991 | Hu | 501/9 |
| 5,085,720 A | * | 2/1992 | Mikeska et al. | 156/89 |
| 5,098,869 A | * | 3/1992 | Morimoto et al. | 501/32 |
| 5,206,190 A | * | 4/1993 | Jean et al. | 501/32 |
| 5,316,985 A | * | 5/1994 | Jean et al. | 501/16 |
| 5,338,710 A | * | 8/1994 | Ishigame et al. | 501/32 |
| 5,612,121 A | * | 3/1997 | Tani et al. | 428/210 |
| 5,855,711 A | * | 1/1999 | Araki et al. | 156/89.16 |
| 6,174,829 B1 | * | 1/2001 | Jean et al. | 501/32 |
| 6,372,676 B1 | * | 4/2002 | Kishida et al. | 501/5 |

FOREIGN PATENT DOCUMENTS

| | | | |
|---|---|---|---|
| EP | 0997941 A2 | * | 3/2000 |
| JP | 1-128305 | * | 5/1989 |
| JP | 1-232797 | * | 9/1989 |
| JP | 2-276105 | * | 11/1990 |

* cited by examiner

Primary Examiner—Cathy Lam
(74) Attorney, Agent, or Firm—Dickstein, Shapiro, Morin & Oshinsky, LLP

(57) ABSTRACT

A multilayered board includes a laminate including a plurality of glass-containing insulating layers, each glass-containing insulating layer being provided with an electrode on the surface thereof. The glass-containing insulating layer is formed by firing a layer containing 60% by volume or less of a glass component before firing, a portion of the glass component is segregated in the surface region of the glass-containing insulating layer by firing, and the electrode is bonded to the surface of the glass-containing insulating layer by means of the segregated glass component. A method for fabricating a multilayered board is also disclosed.

7 Claims, 2 Drawing Sheets

MULTILAYERED BOARD AND METHOD FOR FABRICATING THE SAME

BACKGROUND OF THE INVENTION

1. Field of the Invention

The present invention relates to a multilayered board and to a method for fabricating the same. More particularly, the invention relates to a multilayered board using a glass-containing material which can be fired at low temperatures, and to a method for fabricating the same.

2. Description of the Related Art

As the level of functionality of electronic components is increased and the size of electronic components is reduced, more and more semiconductor ICs and other surface-mounting devices are required be mounted on circuit boards. In order to meet such requirements, various types of multilayered ceramic boards, which are fabricated by laminating ceramic green sheets with applied electrode paste for forming electrodes, followed by firing, have been developed and widely used.

Recently, multilayered boards (low-temperature-fired multilayered boards) have been developed using glass-containing materials, such as glass-ceramic materials, which can be fired at low temperatures.

When a multilayered board is fabricated, an Ag paste containing Ag powder as a conductive component, for example, is widely used as the electrode paste for forming electrodes.

However, when an Ag paste comprising Ag powder, or Ag powder and an oxide serving as a chemical bonding agent, is applied to a board, in which a large amount of ceramic is included in order to increase the strength, and firing is performed simultaneously, if the glass component content is low in the ceramic layer and in the electrodes, it is difficult to obtain satisfactory electrode bonding strength.

The electrode bonding strength may be increased by adding a glass component to the Ag paste so as to improve its wettability on the board, or by including a large amount of a glass component in the board. However, in such cases, the glass component floats on the surfaces of the electrodes, resulting in a decrease in the solderability of the electrodes or in the flexural strength of the board.

SUMMARY OF THE INVENTION

The present invention provides a multilayered board which has a high bonding strength between the electrodes and the glass-containing insulating layers, satisfactory solderability, and a high flexural strength, and provides a method for fabricating the same.

In one aspect of the present invention, a multilayered board includes a laminate including a plurality of glass-containing insulating layers, each glass-containing insulating layer being provided with an electrode on the surface thereof. The glass-containing insulating layer is formed by firing a layer containing 60% by volume or less of a glass component before firing, a portion of the glass component is segregated in the surface region of the glass-containing insulating layer by firing, and the electrode is bonded to the surface of the glass-containing insulating layer by means of the segregated glass component.

In the multilayered board of the present invention, since the glass-containing insulating layer before firing has a glass component content of 60% by volume or less, and the electrode is bonded to the surface of the glass-containing insulating layer by means of the glass component which has been segregated in the surface region by firing, the multilayered board does not have an excessively high glass component content in the glass-containing insulating layer so as to decrease its flexural strength, and it does not have an excessively high glass component content in the electrode so as to decrease its solderability, whereby a high electrode bonding strength can be secured.

"The glass component content of 60% by volume or less before firing" conceptually means that the glass component content in the inorganic component constituting a material for forming the glass-containing insulating layer before firing (green sheet) is 60% by volume or less.

Preferably, in the multilayered board of the present invention, the glass component content is in the range of 60% to 90% by volume within a depth of 1 $\mu$m from the surface of the glass-containing insulating layer provided with the electrode.

By segregating the glass component by firing and by increasing the glass component content within a depth of 1 $\mu$m from the surface of the glass-containing insulating layer to 60% to 90% by volume, it is possible to improve the electrode bonding strength even if the glass component content in the entire glass-containing insulating layer is not increased. Consequently, it is possible to prevent the glass component content in the entire glass-containing insulating layer from increasing excessively, and a high flexural strength can be maintained, thus ensuring the effectiveness of the present invention.

Preferably, the glass-containing insulating layer is composed of a glass-ceramic material.

In the present invention, although it is possible to use materials in which glass and various other insulating components are mixed as the glass-containing insulating layer, in order to attain various electrical characteristics and mechanical characteristics, a glass-ceramic material containing a glass and a ceramic is preferably used. In such a case, the advantage of the present invention is reliably obtained.

Preferably, the electrode contains Ag as a principal conductive component.

In the present invention, although it is possible to use various materials for the electrode, when a material containing Ag as a principal conductive component is used for the electrode, the electrode can have a low resistance and superior bonding strength, thus ensuring the effectiveness of the present invention.

Preferably, the electrode and the glass-containing insulating layer are simultaneously fired.

Although the electrode and the glass-containing insulating layer may be fired separately, by simultaneously firing, it is possible to improve the bonding strength between the electrode and the glass-containing insulating layer and also the fabrication process can be simplified.

In accordance with the present invention, the initial bonding strength of the electrode to the glass-containing insulating layer can be improved, and the initial bonding strength to the glass-containing insulating layer in a tensile test can be 5 N/mm² or more on average.

In accordance with the present invention, since the glass component content in the glass-containing insulating layer is not increased to such an extent that the mechanical strength of the glass-containing insulating layer is greatly decreased, the flexural strength which does not present a difficulty in practical use, namely, a flexural strength of 200 MPa or more, can be achieved.

In the multilayered board of the present invention, preferably, the glass component in the glass-containing insulating layer is a crystallized glass.

By using the crystallized glass as the glass component in the glass-containing insulating layer, the mechanical strength can be further improved, thus further ensuring the effectiveness of the present invention.

In another aspect of the present invention, a method for fabricating a multilayered board, in which a plurality of glass-containing insulating layers are laminated, each glass-containing insulating layer being provided with an electrode on the surface thereof, includes the steps of applying an electrode paste for forming electrodes to the surfaces of green sheets containing 60% by volume or less of a glass component; laminating and pressure-bonding the green sheets applied with the electrode paste to form a pressure-bonded laminate; and heat-treating the pressure-bonded laminate so that the green sheets and the electrode paste are simultaneously fired, a portion of the glass component is segregated in the surface regions of the glass-containing insulating layers, and the electrodes are bonded to the surfaces of the glass-containing insulating layers by means of the segregated glass component.

Since the method for fabricating the multilayered board of the present invention includes the steps described above, it is possible to reliably fabricate the multilayered board which has high electrode bonding strength, high flexural strength, and superior solderability of the electrodes.

Additionally, "the step of laminating and pressure-bonding the green sheets applied with the electrode paste to form a pressure-bonded laminate" conceptually includes a case in which the electrodes (electrode paste) of the individual layers are connected to each other through via-holes made in the green sheets.

"The green sheets containing 60% by volume or less of a glass component" means that the glass component content in the inorganic component constituting the green sheets is 60% by volume or less.

In the method for fabricating the multilayered board of the present invention, one or more of the glass component content in the green sheets, the glass composition, the glass-forming conditions, the pressure-bonding conditions of the green sheets, and the firing conditions may be adjusted so that the glass component content is in the range of 60% to 90% by volume within a depth of 1 μm from the surfaces of the glass-containing insulating layers provided with the electrodes.

That is, in order to avoid a decrease in mechanical strength, the green sheets containing 60% by volume or less of the glass component are used, while by adjusting at least one of the glass component content in the green sheets, the glass composition, the glass-forming conditions, the pressure-bonding conditions of the green sheets, and the firing conditions, the glass component content within a depth of 1 μm from the surfaces of the glass-containing insulating layers to be provided with the electrodes is set in the range of 60% to 90% by volume. Consequently, it is possible to improve the electrode bonding strength by increasing the glass component content only in the surface regions of the glass-containing insulating layers, and it is also possible to maintain a high flexural strength by preventing the glass component content in the entire glass-containing insulating layers from being too high, thus ensuring the effectiveness of the present invention.

Preferably, the green sheets containing 60% by volume or less of the glass component are composed of a glass-ceramic material.

In the present invention, it is possible to use green sheets composed of a material in which glass and various other insulating components are mixed as the green sheets for forming the glass-containing insulating layers. However, in order to attain various electrical characteristics and mechanical characteristics, green sheets composed of a glass-ceramic material containing a glass and a ceramic are preferably used. In such a case, the advantage of the present invention is reliably obtained.

Preferably, an electrode paste containing Ag as a principal conductive component is used as the electrode paste for forming the electrodes.

In the present invention, although it is possible to use various materials for the electrodes, when the electrodes are formed by using the electrode paste containing Ag as a principal conductive component, it is possible to efficiently fabricate a multilayered board in which the electrodes have a high bonding strength to the glass-containing insulating layers and also the electrodes have a low resistance.

Preferably, the electrode paste containing Ag as the principal conductive component does not contain a substantial amount of glass.

By using the electrode paste which substantially does not contain glass as the electrode paste containing Ag as the principal conductive component, it is possible to form electrodes having a low resistance and superior solderability, thus further ensuring the effectiveness of the present invention.

Additionally, since the electrodes are bonded to the glass-containing insulating layers by means of the glass segregated in the surface regions of the glass-containing insulating layers, the electrode bonding strength is secured.

Preferably, the electrode paste containing Ag as the principal conductive component contains at least one material selected from the group consisting of Pb, Bi, Cr, Cu, Mn, Co, and Zn.

By adding at least one material selected from the group consisting of Pb, Bi, Cr, Cu, Mn, Co, and Zn to the electrode paste containing Ag as the principal conductive component, further improvement in the electrode bonding strength is expected.

Preferably, green sheets containing a crystallized glass as the glass component are used.

By using the green sheets containing the crystallized glass, it is possible to fabricate a reliable multilayered board in which the glass-containing insulating layers have a high mechanical strength, and also the entire board has a high mechanical strength, thus further ensuring the effectiveness of the present invention.

In the method for fabricating a multilayered board of the present invention, in the step of heat-treating the pressure-bonded laminate, a constraining layer may be laminated on at least one of the upper surface and the lower surface of the pressure-bonded laminate, the constraining layer being composed of an inorganic material which is not sintered at the firing temperature of the pressure-bonded laminate, and firing is performed in that state, and then the constraining layer is removed, whereby a so-called "non-shrinkage process" may be employed.

By employing the non-shrinkage process when the laminate is fired, it is possible to fabricate a multilayered board which does not shrink in the lateral dimensions, which has a high electrode bonding strength, and which has a superior flexural strength and solderability. By using the multilayered board thus fabricated, it is possible to efficiently produce an electronic component, such as a hybrid IC, in which mounting devices are reliably mounted at desired positions.

DETAILED DESCRIPTION OF EMBODIMENTS OF THE INVENTION

A multilayered board in an embodiment of the present invention will be described with reference to FIG. 1.

Figure 1:
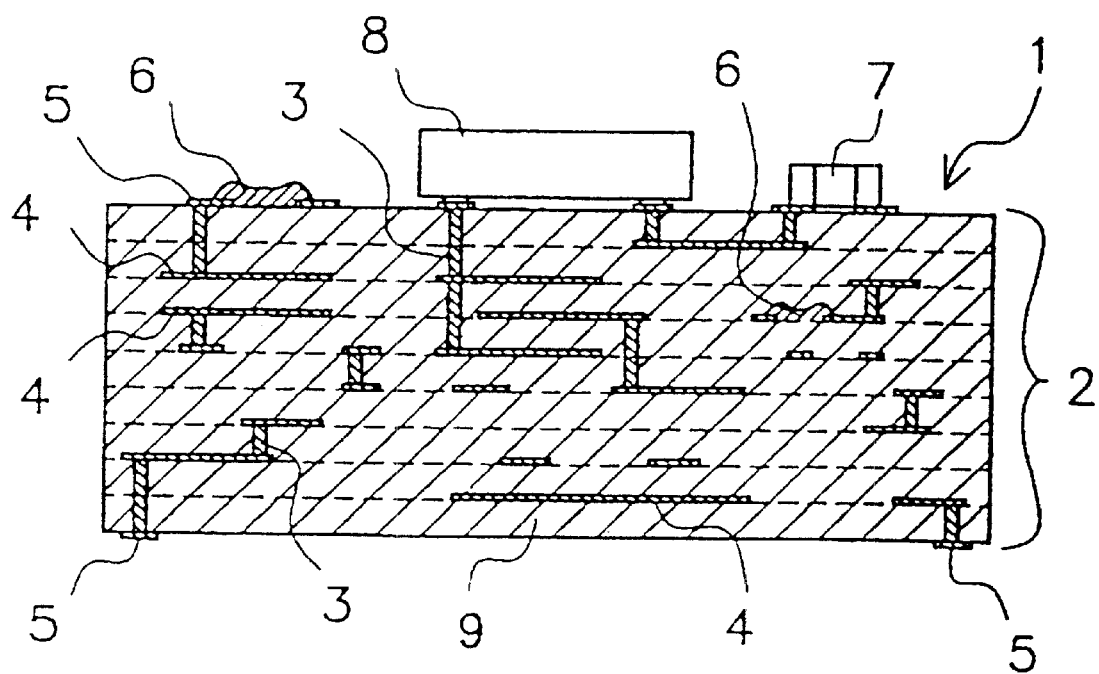
FIG. 1 is a sectional view showing a principal part of a ceramic multilayered module using a multilayered board in an embodiment of the present invention.

A multilayered board 2 shown in FIG. 1 is used for a multilayered module 1 in which a thick-film resistor 6, a chip capacitor 7, a semiconductor device 8, etc., are mounted on the upper principal surface of the multilayered board 2. As shown in FIG. 1, the multilayered board 2 has a multilayered structure in which glass-containing insulating layers 9 and internal electrodes 4 are laminated, and the internal electrodes 4 of the individual layers are electrically connected to each other through via-holes 3 provided on the glass-containing insulating layers 9.

The internal electrodes 4 act as electrodes constituting passive elements, such as inductors and capacitors, or act as leads for electrically connecting passive elements, grounds, internal thick-film resistors 6, etc., to each other.

Surface electrodes 5 are provided on upper and lower principal surfaces of the multilayered board 2. The surface electrodes 5, on the upper principal surface of the multilayered board 2, act as land electrodes for connecting the mounting devices, such as the chip capacitor 7 and the semiconductor device 8, to the multilayered board 2, or act as leads for connecting the thick-film resistors 6 to other elements. The surface electrodes 5, on the lower principal surface of the multilayered board 2, act as input/output terminals for connecting the multilayered board 2 to a motherboard, etc.

A method for fabricating the multilayered board shown in FIG. 1 will be described.

Formation of Green Sheets for a Multilayered Board

First, a method for forming green sheets used for fabricating the multilayered board will be described below.

1) Glass powder composed of $SiO_2$, CaO, $Al_2O_3$, and $B_2O_3$ and alumina ($Al_2O_3$) powder are prepared and mixed at the ratio shown in Table 1.

Additionally, a glass powder other than the crystallized glass powder described above, for example, a $B_2O_3$—$SiO_2$-based glass powder, may be used. Instead of the $Al_2O_3$ powder, other ceramic powders, such as $ZrO_2$ powder or spinel powder, may be used.

2) An organic binder and toluene (solvent) are added to the formulated raw material powder (glass-ceramic raw material powder), and the mixture is thoroughly kneaded with a ball mill to create a homogeneous dispersion, and then de-airing is performed under reduced pressure. Thereby, raw material slurry is prepared.

There are no restrictions on the constituents and compositions of the organic vehicles, such as binders, solvents, and plasticizers, and various types of organic vehicles may be used.

3) The raw material slurry is formed into a sheet on a film, for example, by a casting process using a doctor blade, and a green sheet, for example, with a thickness of 0.1 mm is formed.

4) After the green sheet is dried, it is detached from the film and is die-cut into a given size, and thereby, green sheets for fabricating the multilayered board are obtained.

Formation of Green Sheets for Constraining Layers

Next, a method for forming green sheets for the constraining layers used in a non-shrinkage process will be described.

The green sheet for the constraining layer is a green sheet containing an inorganic material as a principal ingredient, which is not sintered in the firing process of the green sheets for the multilayered board. The green sheet for the constraining layer is laminated on at least one of the upper and lower surfaces of the pressure-bonded laminate of green sheets constituting the multilayered board, and after firing is performed in that state, the green sheet for the constraining layer is removed.

1) $Al_2O_3$ powder is prepared, an organic binder and toluene (solvent) are added thereto, and the mixture is thoroughly kneaded with a ball mill to create a homogeneous dispersion, and then de-airing is performed under reduced pressure. Thereby, raw material slurry is prepared.

There are no restrictions on the constituents and compositions of the organic vehicles, such as binders, solvents, and plasticizers, and various organic vehicles may be used.

2) The raw material slurry is formed into a sheet on a film, for example, by a casting process using a doctor blade, and a green sheet, for example, with a thickness of 0.1 mm is formed.

3) After the green sheet is dried, it is detached from the film and is die-cut into a given size, and thereby, green sheets for the constraining layers are obtained.

Fabrication of the Multilayered Board

A method for fabricating a multilayered board will be described.

1) First, holes for via-holes are made in the green sheets for the glass-containing insulating layers, and a conductive paste or a conductive powder is filled into the holes to form via-holes.

2) In order to form land electrodes for forming passive elements, such as inductors and capacitors, and to form predetermined wiring patterns, an electrode paste is formed into predetermined patterns by screen-printing or the like on the individual green sheets. When necessary, a resistor material paste for forming thick-film resistors is formed by screen-printing or the like.

In this embodiment, as the electrode paste, an electrode paste which contains Ag as the conductive component and which does not contain a glass component is used. However, there are no restrictions on the types of electrode paste to be used, and various electrode pastes, such as an electrode paste containing Ag/Pt powder or Ag/Pd powder as the conductive component, may be used.

3) A plurality of the green sheets are laminated, and the green sheets for the constraining layers are laminated on the upper and lower surfaces of the laminate, and then pressure-bonding is performed to form a pressure-bonded laminate.

Figure 2:
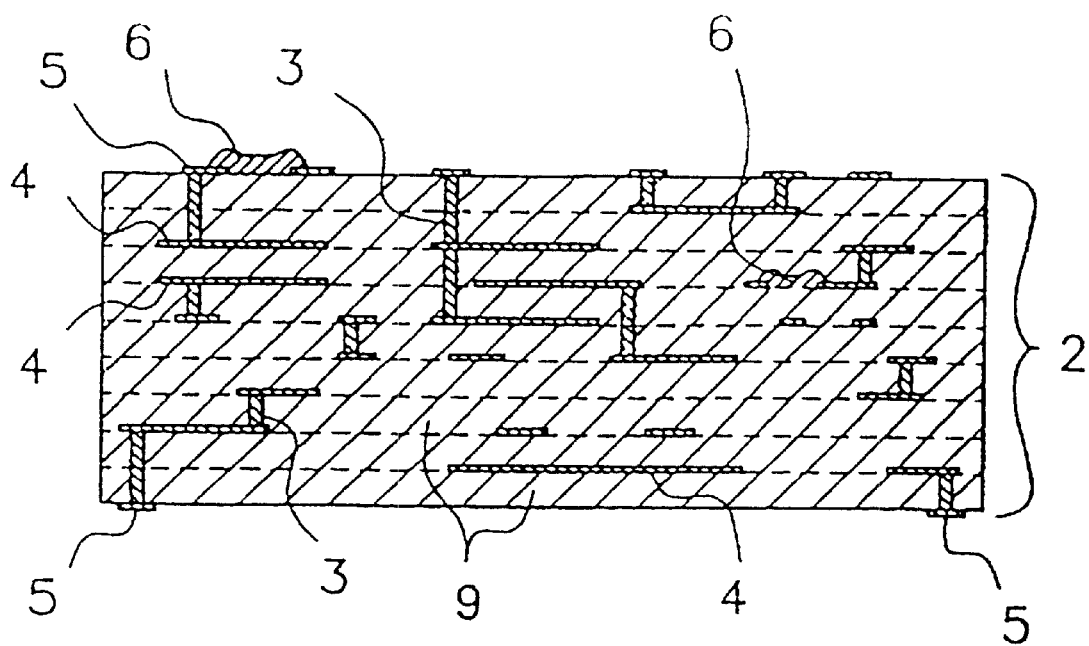
FIG. 2 is a sectional view showing a principal part of a multilayered board in the embodiment of the present invention.

4) The pressure-bonded laminate may be cut into an appropriate size or parting grooves may be formed when necessary, and then firing is performed, for example, at approximately 800 to 1,100° C. The constraining layers are removed, and thereby, a multilayered board 2 as shown in FIG. 2 is obtained. In FIG. 2, similar elements to those in FIG. 1 are represented by the same reference numerals as those in FIG. 1.

5) Surface-mounting devices, such as a chip capacitor 7 and a semiconductor device 8, are mounted on the multilayered board 2, and thereby, a ceramic multilayered module 1 as shown in FIG. 1 is obtained.

In accordance with the method for fabricating the multilayered board described above, it is possible to efficiently fabricate a multilayered board with a strong bonding strength between the electrodes and the glass-containing insulating layers, and which has superior flexural strength and solderability.

Fabrication of Samples for Characteristics Evaluation

For each sample, a plurality of green sheets for the board formed as described above were laminated, and a plurality of green sheets for constraining layers were disposed on the upper and lower surfaces of the laminate, followed by pressure-bonding, to form a pressure-bonded laminate. The pressure-bonded laminate was fired under the following conditions. Heating was performed at a rate of 1.5° C./min up to 400° C. and at a rate of 5° C./min to 60° C./min from 400° C. to 900° C., and the temperature was held at 900° C. for 5 to 60 minutes. The constraining layers were removed after firing was performed, and thereby the samples for the characteristics evaluation were obtained.

That is, in this example, the firing conditions (the heating rate from 400° C. to 900° C. and the holding time at 900° C.) were adjusted as described above so that the samples had different glass component contents in the surface regions of the glass-containing insulating layers.

Figure 3:
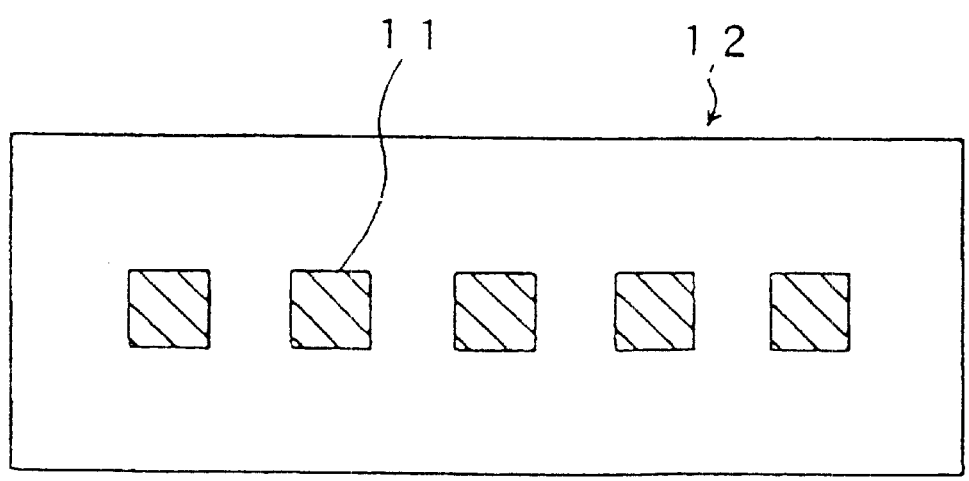
FIG. 3 is a plan view showing an electrode land pattern which may be used for evaluating the electrode bonding strength.

In order to check the electrode bonding strength and the solderability, samples for evaluation were prepared as follows. For each sample, as shown in FIG. 3, a green sheet 12 of the type used for forming the board was provided with 2 mm square land electrodes 11 and disposed as the outermost layer on a laminate of a plurality of board-type green sheets not provided with land electrodes, and pressure-bonding was performed. The pressure-bonded laminate was fired under the same firing conditions as described above, and thereby, the sample for evaluation was obtained.

Evaluation of Characteristics

With respect to the samples for evaluation fabricated as described above, the glass component content, the solderability, the electrode bonding strength, and the flexural strength were checked.

The results thereof are shown in Table 1.

The glass component content within a depth of 1 μm from the surface was obtained using analytical curves of the elemental glass component (Ca) and $Al_2O_3$ from a mapping analysis.

The solderability was evaluated by dipping the 2 mm square land electrodes in a molten solder (Sn—Pb solder).

In order to evaluate the electrode bonding strength, L-shaped leads were soldered to the 2 mm square land electrodes, in which the solderability had been evaluated, using an Sn—Pb solder, and a tensile test was performed. The value at which the solder joint was broken was defined as the electrode bonding strength.

The flexural strength was measured by a three-point bending test, using strip specimens.

Additionally, the electrode bonding strength and the flexural strength were measured using an Autograph manufactured by Shimadzu Corporation.

In Table 1, the criteria of the evaluation items are as follows.

Solderability: When the solder wetting area of the land electrode was 95% or more of the area of the land electrode, the solderability was evaluated as good (G), and when the solder wetting area was less than 95%, it was evaluated as poor (NG).

Electrode Bonding Strength: When the value at which soldering was broken in the tensile test after the L-shaped lead was soldered to the land electrode using the Sn—Pb solder was 20 N/2 mm square (5 N/mm$^2$) or more, the electrode bonding strength was evaluated as good (G), and when the value was less than 20 N/2 mm square (5 N/mm$^2$), it was evaluated as poor (NG).

Flexural strength: When the result of the three-point bending test was 200 MPa or more, the flexural strength was evaluated as good (G), and when the result was less than 200 MPa, it was evaluated as poor (NG).

As is obvious from Table 1, with respect to sample No. 3 and Nos. 5 to 8, the solderability, the electrode bonding strength, and the flexural strength were all evaluated as good. That is, in accordance with the present invention, by segregating glass in the surface regions of the glass-containing insulating layers having a high ceramic content and a superior mechanical strength, it is possible to efficiently fabricate a multilayered board provided with electrodes having a high flexural strength and superior solderability.

Although not shown in Table 1, when the glass component content in glass-containing insulating layers before firing was 60% by volume or less, if the glass content within

TABLE 1

| Sample No. | Glass Powder Content (% by volume) | Alumina Powder Content (% by volume) | Additive to Electrodes | Glass Component Content within 1 μm from Surface (% by volume) | Solderability | Electrode Bonding Strength | Flexural Strength |
|---|---|---|---|---|---|---|---|
| 1 | 100 | 0 | Nil | 100 | NG | — | NG |
| 2 | 65 | 35 | Nil | 65 | G | G | NG |
| 3 | 60 | 40 | Nil | 60 | G | G | G |
| 4 | 65 | 35 | Nil | 72 | G | G | NG |
| 5 | 60 | 40 | Nil | 68 | G | G | G |
| 6 | 50 | 50 | Nil | 60 | G | G | G |
| 7 | 60 | 40 | Nil | 90 | G | G | G |
| 8 | 60 | 40 | $Bi_2O_3$ | 60 | G | G | G |

1 μm from the surfaces after firing was less than 60% by volume, the electrode bonding strength tended to be decreased.

When the glass component content in glass-containing insulating layers before firing was 60% or less and the glass component content within 1 μm from the surfaces was 60% by volume or more after firing, if an electrode paste containing a glass component was used, the solderability of electrodes tended to be decreased. Therefore, the electrode paste which does not substantially contain a glass component is preferably used.

In the embodiment described above, an example was shown in which by adjusting the firing conditions, the glass-containing insulating layers had different glass component contents in the surface regions. However, it is also possible to control the glass component content on the surfaces of the glass-containing insulating layers by adjusting the glass composition, the glass fabrication conditions, or the pressure-bonding conditions of the green sheets.

It is to be understood that the present invention is not limited to the embodiment described above. Various alterations can be made while not deviating from the fair spirit and scope of the present invention, with respect to the types and compositions of materials constituting the glass-containing insulating layers, the glass component content in the glass-containing insulating layers, the glass component content in the surface regions of the glass-containing insulating layers, types of conductive components constituting electrodes, specific firing conditions, etc.

What is claimed is:

1. A multilayered board comprising a laminate comprising a plurality of glass-containing insulating layers, each glass-containing insulating layer being provided with an electrode on the surface thereof, wherein the glass-containing insulating layer comprises a fired layer made of a material containing an insulating component and 60% by volume or less of a glass component before firing, a portion of the glass component is segregated in the surface region of the glass-containing insulating layer, and the electrode is bonded to the surface of the glass-containing insulating layer by the segregated glass component, and wherein the glass component content is in the range of 60% to 90% by volume within a depth of 1 μm from the surface of the glass-containing insulating layer provided with the electrode.

2. A multilayered board according to claim 1, wherein the glass-containing insulating layer comprises a glass-ceramic material, and the layer containing 60% by volume or less of a glass component is a green glass ceramic layer.

3. A multilayered board according to claim 1, wherein the electrode contains Ag as a principal conductive component.

4. A multilayered board according to claim 1, wherein the electrode and the glass-containing insulating layer are cofired.

5. A multilayered board according to claim 1, wherein the initial bonding strength of the electrode to the glass-containing insulating layer in a tensile test is 5 N/mm$^2$ or more on average.

6. A multilayered board according to claim 1, wherein the glass-containing insulating layer has a flexural strength of 200 MPa or more.

7. A multilayered board according to claim 1, wherein the glass component in the glass-containing insulating layer is a crystallized glass.

* * * * *